(12) United States Patent
Kim

(10) Patent No.: US 7,567,483 B2
(45) Date of Patent: Jul. 28, 2009

(54) SEMICONDUCTOR MEMORY DEVICE AND METHOD FOR OPERATING THE SAME

(75) Inventor: Kyung-Hoon Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 91 days.

(21) Appl. No.: 11/819,801

(22) Filed: Jun. 29, 2007

(65) Prior Publication Data
US 2008/0080263 A1    Apr. 3, 2008

(30) Foreign Application Priority Data
Sep. 29, 2006   (KR) ............... 10-2006-0096441

(51) Int. Cl.
*G11C 8/00* (2006.01)
(52) U.S. Cl. ............ 365/233; 365/194; 365/189.07
(58) Field of Classification Search ............... 365/233, 365/194, 189.07, 189.11, 193, 94, 189.09, 365/191
See application file for complete search history.

(56) References Cited

U.S. PATENT DOCUMENTS

| 5,703,513 | A | 12/1997 | Hashizume et al. |
| 5,926,434 | A | 7/1999 | Mori |
| 6,232,811 | B1 | 5/2001 | Ihm |
| 6,529,423 | B1 | 3/2003 | Yoon et al. |
| 2003/0002357 | A1* | 1/2003 | Kwon et al. ............ 365/194 |
| 2003/0147298 | A1* | 8/2003 | Ooishi et al. ........... 365/233 |

FOREIGN PATENT DOCUMENTS

| JP | 09-074337 | 3/1997 |
| JP | 11-261408 | 9/1999 |
| JP | 2001-111394 | 4/2001 |
| KR | 1999-002779 | 1/1999 |
| KR | 10-0255850 B1 | 2/2000 |

OTHER PUBLICATIONS

Korean Office Action issued in corresponding Korean Patent Application No. KR 10-2006-0096441, dated on Feb. 22, 2008.

* cited by examiner

*Primary Examiner*—Dang T Nguyen
(74) *Attorney, Agent, or Firm*—Mannava & Kang, P.C.

(57) ABSTRACT

A semiconductor memory device includes a first clock input unit for generating a first clock signal based on a signal at an intersection of a system clock signal and an inverted system clock signal; a second input unit for generating a second clock signal based on a signal at an intersection of the system clock signal and a reference signal; a third input unit for generating a third clock signal based on a signal at an intersection of the inverted system clock signal and the reference signal; a delay unit for generating a delay clock signal by delaying the first clock signal in response to a delay control signal; and a clock delay control unit for generating the delay control signal in response to a phase difference between the second clock signal and the delay clock signal or a phase difference between the third clock signal and the delay clock signal.

16 Claims, 7 Drawing Sheets

SEMICONDUCTOR MEMORY DEVICE AND METHOD FOR OPERATING THE SAME

CROSS-REFERENCE TO RELATED APPLICATION

The present invention claims priority of Korean patent application number 10-2006-0096441, filed on Sep. 29, 2006, which is incorporated by reference in its entirety.

BACKGROUND OF THE INVENTION

The present invention relates to a semiconductor memory device, and more particularly, to a circuit for receiving and transferring a clock and command signals of a semiconductor memory device.

A semiconductor memory device serves to store data in a system which includes a plurality of semiconductor devices. When a data processing device, e.g., a central processing unit (CPU), requires data, the semiconductor memory device outputs data corresponding to an address input from the data processing device or stores data received from the data processing device into a memory cell corresponding to the address.

As an operation speed of the system is increased and a semiconductor integrating technology is developed, the semiconductor memory device is required to perform a data access operation at a high speed. For performing the data access operation at a high speed, a synchronous memory device has been developed for performing the data access operation in synchronization with a system clock.

For improving the operation speed of the synchronous memory device, a double data rate (DDR) synchronous memory device has been developed for performing the data access operation in synchronization with both of a rising edge and a falling edge of the system clock.

Since the DDR synchronous memory device should input or output data in synchronization with both of a rising edge and a falling edge of the system clock, the DDR synchronous memory device should process two data within one period of the system clock. That is, the DDR synchronous memory device should output data or store data at every rising edge and every falling edge of the system clock.

Generally, the DDR synchronous memory device receives and transfers the system clock and an inverted system clock to its internal circuit in response to a reference signal. At this time, it is very important to receive the system clock and the inverted system clock at a same duty rate because the DDR synchronous memory device performs its operation in synchronization with the rising edge and the falling edge of the system clock.

FIG. 1 is a schematic diagram illustrating a distortion of a system clock signal input to a semiconductor memory device.

Generally, after fabricating, the semiconductor memory device is arranged at a module and, a plurality of modules form a group. Referring to FIG. 1, first to ninth semiconductor memory devices D1 to D9 form a module, first and second termination resistors R1 and R2 for adjusting input/output impedances of each semiconductor memory device are arranged at one side of the first to ninth semiconductor memory devices D1 to D9, and second to eleventh transmission lines TL1 to TL10 are arranged between the first to ninth semiconductor memory devices D1 to D9.

A data signal input through a first transmission line TL0 is transferred to each semiconductor memory device via the second to eleventh transmission lines TL1 to TL10. A system clock signal and an inverted system clock signal are also transferred to each semiconductor memory device via the second to eleventh transmission lines TL1 to TL10.

At this time, lengths of transmission lines coupled to each semiconductor memory device are different from each other due to differences between positions of the first to ninth semiconductor memory devices D1 to D9. Further, transmission lines for transferring the system clock signal and the inverted system clock signal to each semiconductor memory device are not same.

Accordingly, delay amounts of the system clock signal transferred to each semiconductor memory device are different from each other, and delay amounts of the system clock signal and the inverted system clock signal transferred to each semiconductor memory device are different from each other because impedances of each transmission line does not match with the input impedances of each semiconductor memory device.

As described above, because of a difference between input timings of a system clock signal and an inverted system clock signal input to one semiconductor memory device, a timing margin for receiving the system clock signal in response to a reference signal VREF is different from that for receiving the inverted system clock signal.

For the reference, the reference signal VREF maintains a half voltage level of a section that the system clock signal and the inverted system clock signal are transited. It is desirable that a voltage level of the reference signal VREF is substantially the same as a voltage level of an intersection of the system clock signal and the inverted system clock signal.

However, the voltage level of the reference signal VREF is not same as that of the intersection of the system clock signal and the inverted system clock signal because the delay amount of the system clock signal which is transferred to one semiconductor memory device is different from that of the inverted system clock signal according to a position of the semiconductor memory device.

If a voltage difference of the reference signal VREF and the intersection of the system clock signal and the inverted system clock signal is beyond a permissible range, it is difficult for the semiconductor memory device to receive the system clock signal. Even if the semiconductor memory device receives the system clock signal, an operational timing margin of the semiconductor memory device is reduced.

SUMMARY OF THE INVENTION

Embodiments of the present invention are directed to providing a semiconductor memory device including a circuit for adjusting a voltage level of an intersection of a system clock signal and an inverted system clock signal to be substantially the same as a voltage level of a reference signal, and a method for operating the same.

Furthermore, embodiments of the present invention are directed to providing a module including a plurality of semiconductor memory devices for correcting a mismatch between input timings of a system clock signal and an inverted system clock signal input to each semiconductor memory device, and a method for operating the same.

In accordance with a first aspect of the present invention, there is provided a semiconductor memory device, including: a first clock input unit for generating a first clock signal based on an intersection of a system clock signal and an inverted system clock signal; a second input unit for generating a second clock signal based on an intersection of the system clock signal and a reference signal; a third input unit for generating a third clock signal based on an intersection of the inverted system clock signal and the reference signal; a delay unit for generating a delay clock signal by delaying the first clock signal in response to a delay control signal; and a clock delay control unit for generating the delay control signal in response to a phase difference between the second clock signal and the delay clock signal or a phase difference between the third clock signal and the delay clock signal.

In accordance with a second aspect of the present invention, there is provided a method for driving a semiconductor memory device, including: generating a first clock signal based on an intersection of a system clock signal and an inverted system clock signal; generating a second clock signal based on an intersection of the system clock signal and a reference signal; generating a third clock signal based on an intersection of the inverted system clock signal and the reference signal; generating a delay clock signal by delaying the first clock signal by a predetermined delay amount; and controlling the predetermined delay amount in response to a phase difference between the second clock signal and the delay clock signal or a phase difference between the third clock signal and the delay clock signal.

In accordance with a third aspect of the present invention, there is provided a semiconductor memory device, including: a first clock input unit for generating a first clock signal based on an intersection of a system clock signal and an inverted system clock signal; a second clock input unit for generating a second clock signal based on an intersection of the system clock signal and a reference signal; a third clock input unit for generating a third clock signal based on an intersection of the inverted system clock signal and the reference signal; a command signal input unit for receiving a command signal and the reference signal to output a first internal command signal; a clock delay control unit for generating a delay control signal in response to a phase difference between the first clock signal and the second clock signal or a phase difference between the first clock signal and the third clock signal; a command delay unit for generating a second internal command signal by delaying the first internal command signal in response to the delay control signal; and a latch unit for latching the second internal command signal in response to the first clock signal.

In accordance with a fourth aspect of the present invention, there is provided a method for driving a semiconductor memory device, including: generating a first clock signal based on an intersection of a system clock signal and an inverted system clock signal; generating a second clock signal based on an intersection of the system clock signal and a reference signal; generating a third clock signal based on an intersection of the inverted system clock signal and the reference signal; generating a first internal command signal based on receiving a command signal and the reference signal; generating a delay control signal in response to a phase difference between the first clock signal and the second clock signal, or a phase difference between the first clock signal and the third clock signal; generating a second internal command signal by delaying the first internal command signal in response to the delay control signal; and latching the second internal command signal in response to the first clock signal.

In accordance with a fifth aspect of the present invention, there is provided a memory module, including: a plurality of first transmission lines for transferring a system clock signal and an inverted system clock signal; a first memory device including a first clock input circuit for correcting a delay mismatch occurring while the system clock signal and the inverted system clock signal are transferred through the first transmission lines; a plurality of second transmission lines for transferring the system clock signal and the inverted system clock signal transferred to the first transmission lines; and a second memory device including a second clock input circuit for correcting a delay mismatch occurring while the system clock signal and the inverted system clock signal are transferred through the first and second transmission lines.

In accordance with a sixth aspect of the present invention, there is provided a method for driving a memory module including a first memory device for receiving a system clock signal and an inverted system clock signal transferred through a first transmission line, and a second memory device for receiving the system clock signal and the inverted system clock signal transferred through the first transmission line and a second transmission line, the method including: a first step of delaying the system clock signal and the inverted system clock signal input to the first memory device in response to a delay mismatch occurring while the system clock signal and the inverted system clock signal are transferred through the first transmission line; and a second step of delaying the system clock signal and the inverted system clock signal input to the second memory device in response to a delay mismatch occurring while the system clock signal and the inverted system clock signal are transferred through the first and second transmission lines.

DESCRIPTION OF SPECIFIC EMBODIMENTS

An embodiment of the invention is directed to a semiconductor memory device including a circuit for adjusting a voltage level of an intersection of a system clock signal and an inverted system clock signal to be substantially the same as a voltage level of a reference signal.

Hereinafter, a semiconductor memory device in accordance with the present invention will be described in detail referring to the accompanying drawings.

Figure 1:
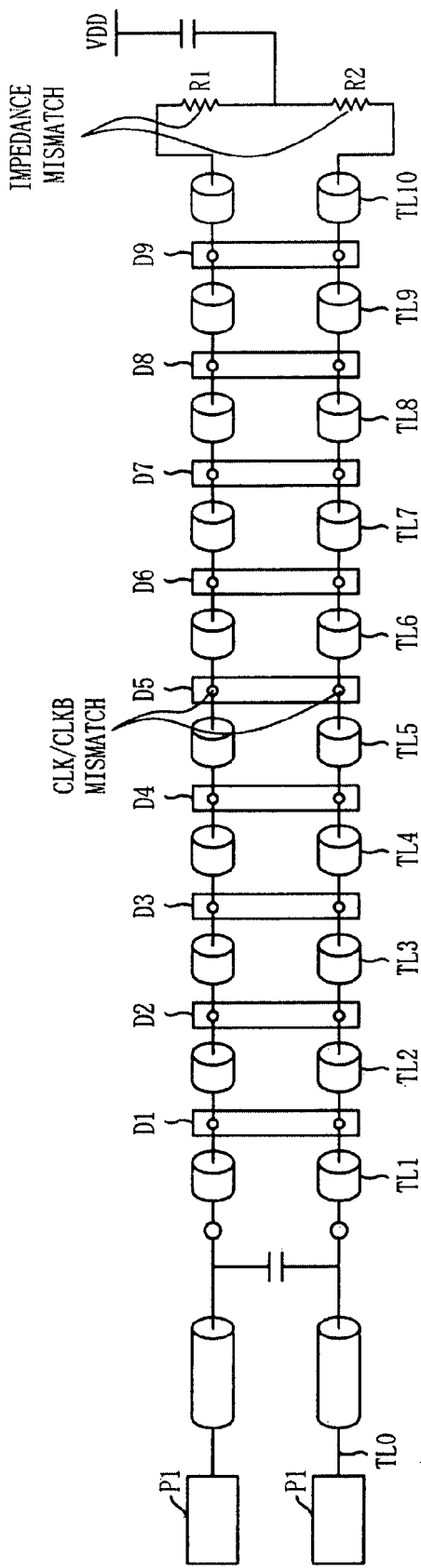
FIG. 1 is a schematic diagram illustrating a distortion of a system clock signal input to a semiconductor memory device.
Figure 2:
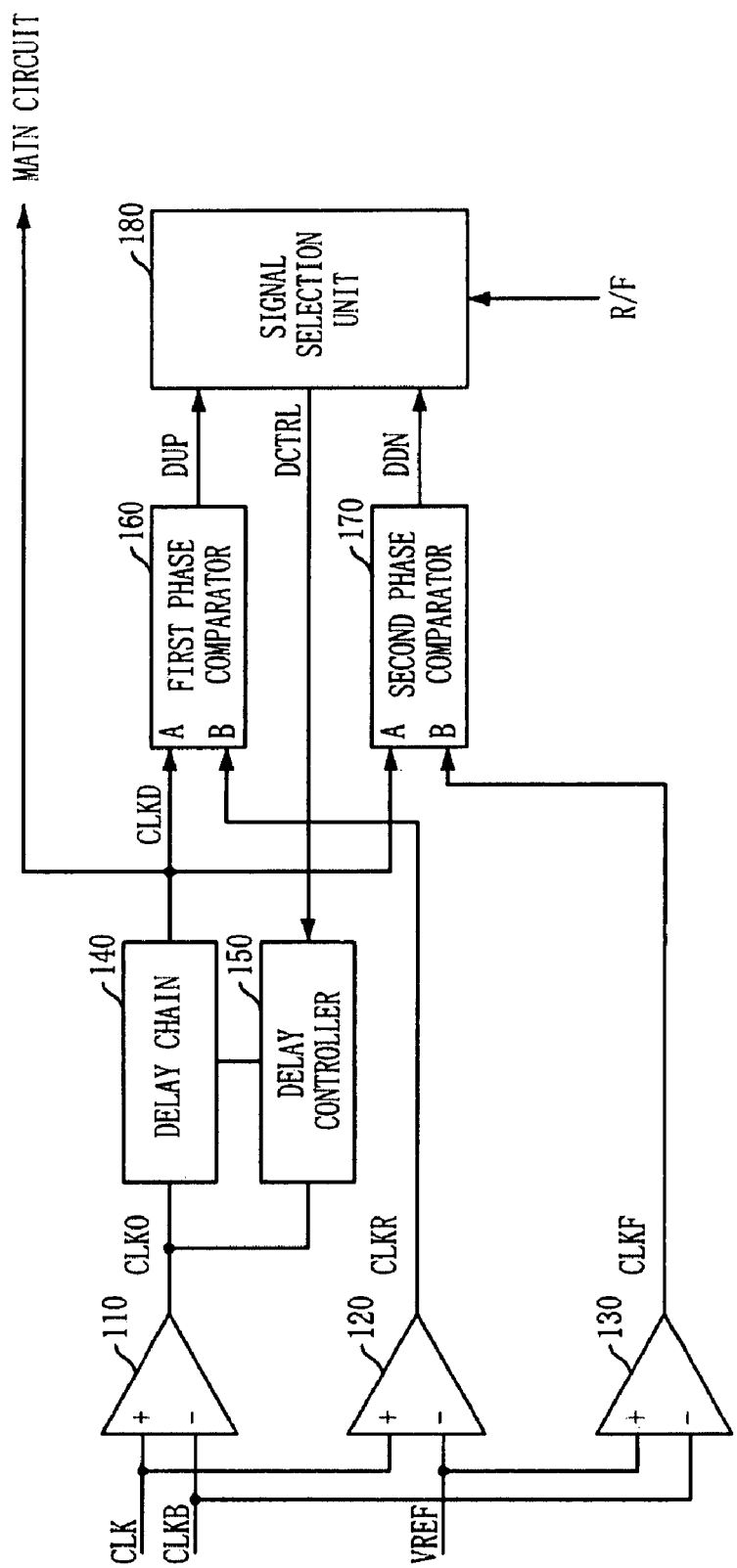
FIG. 2 is a block diagram of a semiconductor memory device in accordance with a first embodiment of the present invention.

FIG. 2 is a block diagram of a semiconductor memory device in accordance with a first embodiment of the present invention.

As shown in FIG. 2, the semiconductor memory device in accordance with the first embodiment of the present invention includes first to third clock input units 110 to 130, a delay chain 140, a delay controller 150, first and second phase comparators 160 and 170, and a signal selection unit 180.

The first clock input unit 110 receives a system clock signal CLK and an inverted system clock signal CLKB to output a first clock signal CLK0. The second clock input unit 120 receives the system clock signal CLK and a reference signal VREF to output a second clock signal CLKR. The third clock input unit 130 receives the inverted system clock signal CLKB and the reference signal VREF to output a third clock signal CLKF.

The delay chain 140 delays the first clock signal CLK0 to generate a delayed clock signal CLKD. The delay controller 150 controls a delay amount of the delay chain 140 in response to a delay control signal DCTRL. The first phase comparator 160 compares a phase of the second clock signal CLKR with that of the delayed clock signal CLKD to output an up signal DUP according to the comparison result. The second phase comparator 170 compares a phase of the third clock signal CLKF with that of the delayed clock signal CLKD to output a down signal DDN according to the comparison result. The signal selection unit 180 outputs the delay control signal DCTRL by selecting one of the up signal DUP and the down signal DDN in response to a selection signal R/F.

Figure 3A:
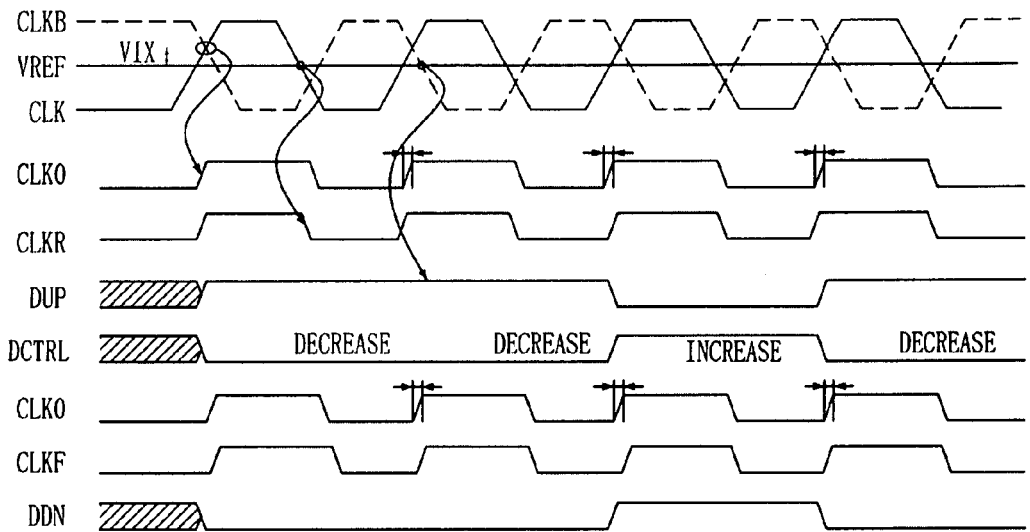
FIGS. 3A and 3B are timing diagrams depicting an operation of the semiconductor memory device shown in FIG. 2.
Figure 3B:
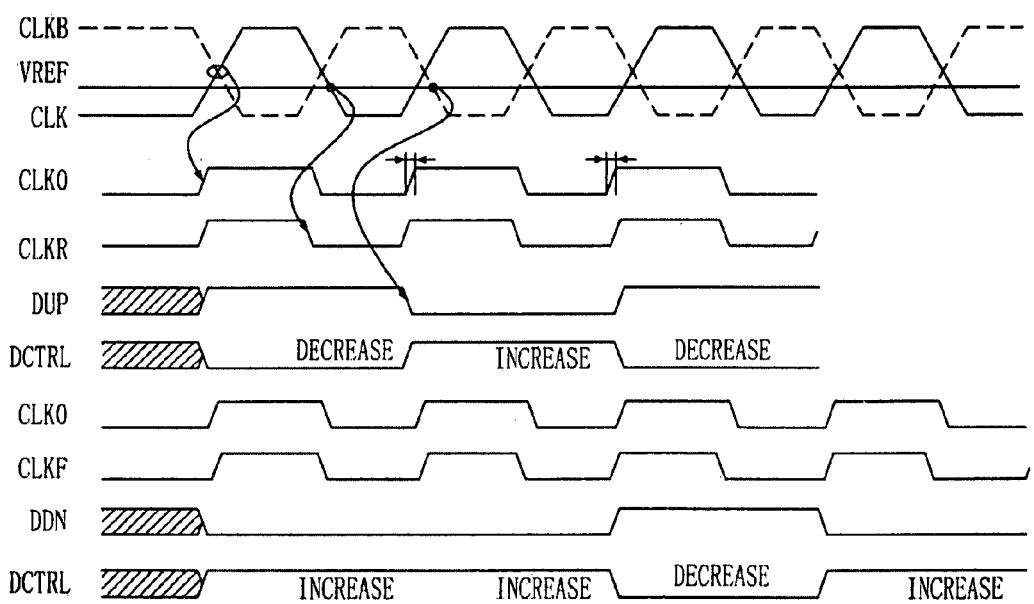

FIGS. 3A and 3B are timing diagrams depicting an operation of the semiconductor memory device shown in FIG. 2.

In particular, in case of FIG. 3A, the reference signal VREF maintains a half voltage level of a section that the system clock signal CLK is transited, but a voltage level of the intersection of the system clock signal CLK and the inverted system clock signal CLKB is not same as that of the reference signal VREF because delay amount of the system clock signal CLK is different from that of the inverted system clock signal CLKB. In case of FIG. 3B, the reference signal VREF does not maintain a half voltage level of a section that the system clock signal CLK is transited.

It is assumed that the first clock signal CLK0 is transferred to the semiconductor memory device as an operating clock signal when the voltage level of the intersection of the system clock signal CLK and the inverted system clock signal CLKB is not same as that of the reference voltage VREF. In this case, the semiconductor memory device performs an internal operation by receiving data, addresses and commands in synchronization with the first clock signal CLK0, and thus, an operation margin of the semiconductor memory device can be narrower than a preset operation margin so that an error occurs during the operation.

Accordingly, the semiconductor memory device in accordance with the first embodiment of the present invention includes the second and third clock input units 120 and 130, the delay chain 140, the delay controller 150, the first and second phase comparators 160 and 170 and the signal selection unit 180 as well as the first clock input unit 110 in order to minimizing an error between the signal at the intersection of the system clock signal CLK and the inverted system clock signal CLKB and the reference signal VREF.

Hereinafter, referring to FIGS. 3A and 3B, the operation of the semiconductor memory device is explained in detail.

Herein, an error value "VIX" shown in FIG. 3A denotes a difference voltage level between the reference signal VREF and the signal at the intersection of the system clock signal CLK and the inverted system clock signal CLKB.

When a plurality of semiconductor memory device is arranged at a module, the error value "VIX" varies according to a position where each semiconductor memory device is arranged. This is because impedance values of the transmission lines are different from each other when the system clock signal CLK and the inverted system clock signal CLKB are transferred to each semiconductor memory device. Even if the delay amount of the system clock signal CLK transferred to each semiconductor memory device is same as that of the inverted system clock signal CLKB, the error "VIX" is induced while a signal is inputted to the semiconductor memory device. In this time, the first clock CLK0 and the delayed clock signal CLKD are transited at an arbitrary timing different from a desirable timing.

Accordingly, in the present invention, each semiconductor memory device arranged at a module includes a circuit for correcting the error value "VIX". That is, when delay amount of the system clock signal CLK transferred to each semiconductor memory device is different from that of the inverted system clock signal CLKB and thus the signal at their intersection is not the same as the reference signal VREF, the present invention adjusts the delay amount of the system clock signal CLK, the delay amount of the inverted system clock signal CLKB, or both delay amounts of the system clock signal CLK and the inverted system clock signal CLKB. As a result, the voltage level of the intersection of the system clock signal CLK and the inverted system clock signal CLKB can be substantially the same as that of the reference signal VREF.

For this, the first clock input unit 110 outputs the first clock signal CLK0 transited in response to the signal at the intersection of the system clock signal CLK and the inverted system clock signal CLKB. The second clock input unit 120 outputs the second clock signal CLKR transited in response to the signal at the intersection of the system clock signal CLK and the reference signal VREF. The third clock input unit 130 outputs the third clock signal CLKF transited in response to the signal at the intersection of the inverted system clock signal CLKB and the reference signal VREF.

The first phase comparator 160 compares the phase of the second clock signal CLKR with that of the delayed clock signal CLKD. When the second clock signal CLKR leads the delayed clock signal CLKD, the first phase comparator 160 outputs the up signal DUP with a logic high level. The second phase comparator 170 compares the phase of the third clock signal CLKF with that of the delayed clock signal CLKD. When the third clock signal CLKF leads the delayed clock signal CLKD, the second phase comparator 170 outputs the down signal DDN with a logic high level.

The signal selection unit 180 selects one of the up signal DUP and the down signal DDN in response to the selection signal R/F to output the delay control signal DCTRL to the delay controller 150. In detail, when it is required to compare a transition timing of the system clock signal CLK, the signal selection unit 180 outputs the up signal DUP as the delay control signal DCTRL is inactivated to a logic low level in response to the selection signal R/F. When it is required to compare a transition timing of the inverted system clock signal CLKB, the signal selection unit 180 outputs the down signal DDN as the delay control signal DCTRL is activated to a logic high level in response to the selection signal R/F.

The delay controller 150 controls the delay amount of the delay chain 140 in response to the delay control signal DCTRL. In detail, the delay controller 150 increases the delay amount when the delay control signal DCTRL is inputted with a logic high level, and decreases it when the delay control signal DCTRL is inputted with a logic low level. Accordingly, the delay chain 140 outputs the delayed clock signal CLKD by delaying the first clock signal CLK0.

Finally, if the phase of the second clock CLKR is same as that of the delayed clock signal CLKD, or the phase of the third clock signal CLKF is same as that of the delayed clock signal CLKD, the signal selection unit 180 does not output the delay control signal DCTRL. Accordingly, the delay controller 150 does not control the delay amount of the delay chain 140. At this time, the delayed clock signal CLKD is used as an operating clock signal of the semiconductor memory device for latching the data, the addresses and the commands.

Figure 4A:
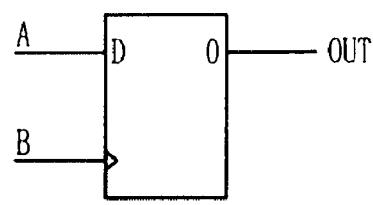
FIGS. 4A and 4B are schematic circuit diagrams of examples of a first phase comparator shown in FIG. 2.
Figure 4B:
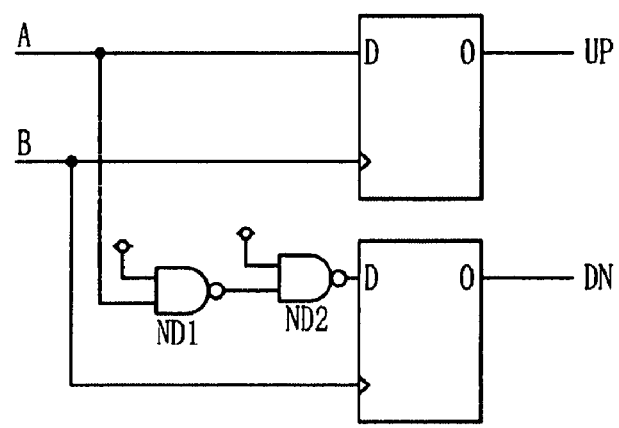

FIGS. 4A and 4B are schematic circuit diagrams of examples of the first phase comparator 160 shown in FIG. 2.

For reference, the second phase comparator 170 has substantially the same structure as that of the first phase comparator 160.

As shown in FIGS. 4A and 4B, the first phase comparator 160 includes one or more flip-flops for receiving one input signal, i.e., the delayed clock signal CLKD, as its input and the other input signal, i.e., the second clock signal CLKR, as its clock signal.

Figure 5:
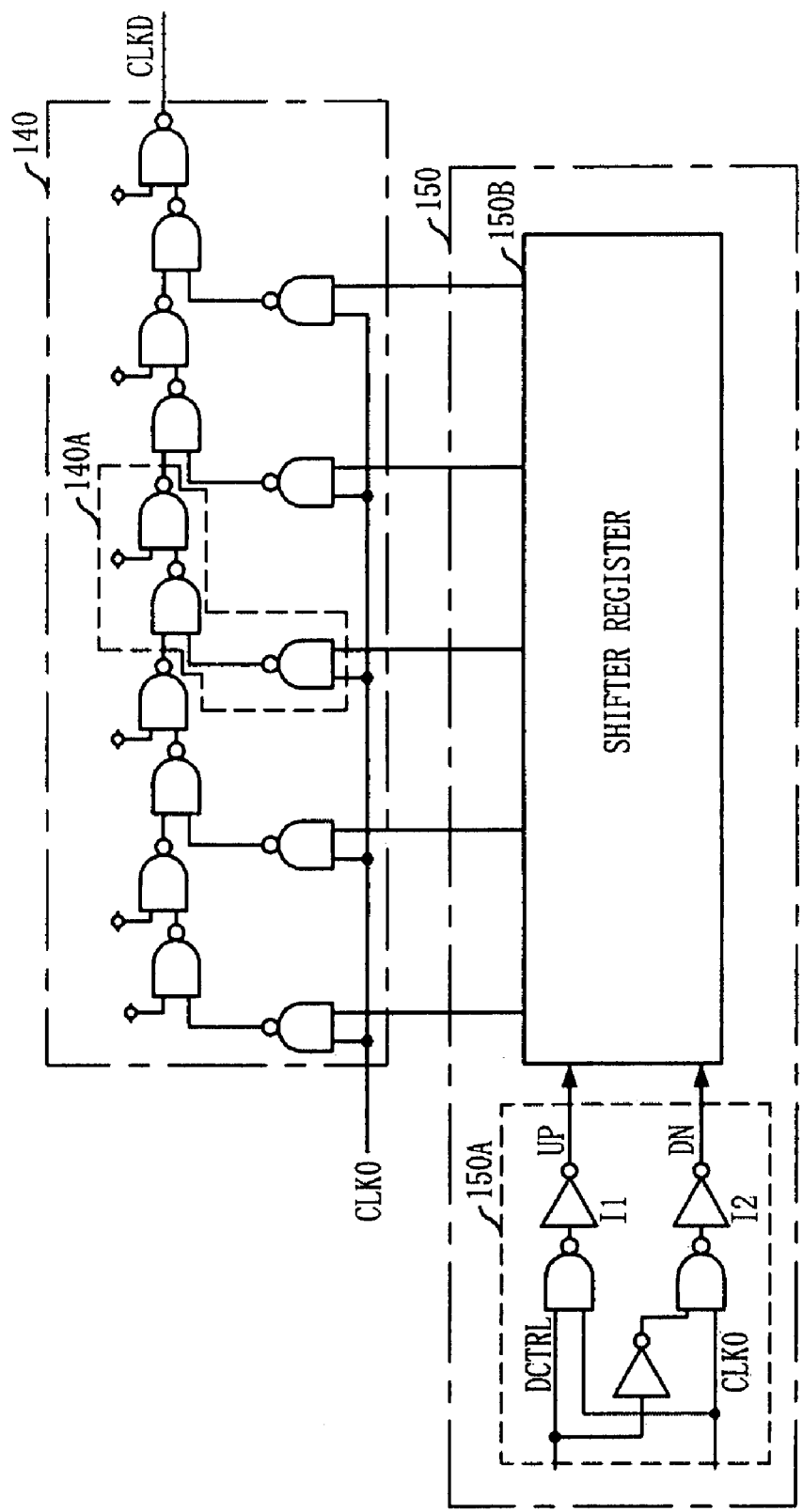
FIG. 5 is a schematic circuit diagram of a delay chain and a delay controller shown in FIG. 2.

FIG. 5 is a schematic circuit diagram of the delay chain 140 and the delay controller 150 shown in FIG. 2.

As shown in FIG. 5, the delay chain 140 includes a plurality of unit delays 140A connected in series so that the first clock signal CLK0 passes through a number of unit delays corresponding to a plurality of control signals outputted from the delay controller 150.

The delay controller 150 includes a signal combination unit 150A and a shifter register 150B. The signal combination unit 150A receives the first clock signal CLK0 and the delay control signal DCTRL to output first and second shifting signals UP and DN. The shifter register 150B shifts the control signals to left or right and output them in response to the first and second shifting signals UP and DN.

Figure 6:
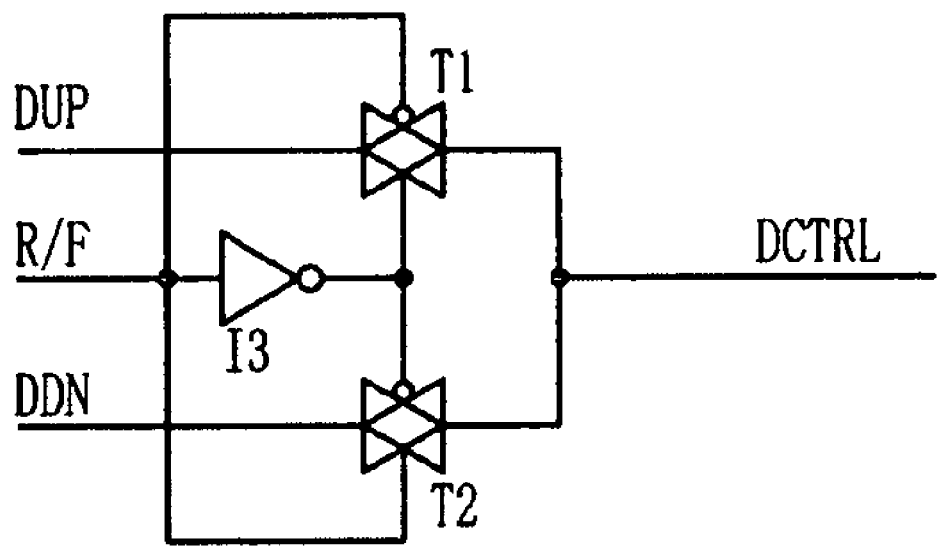
FIG. 6 is a schematic circuit diagram of a signal selection unit shown in FIG.2.

FIG. 6 is a schematic circuit diagram of the signal selection unit 180 shown in FIG. 2.

As shown, the signal selection unit 180 includes first and second transmission gates T1 and T2. The first and second transmission gates T1 and T2 select one of the up signal DUP and the down signal DDN and output the selected one as the delay control signal DCTRL in response to the selection signal R/F.

Figure 7:
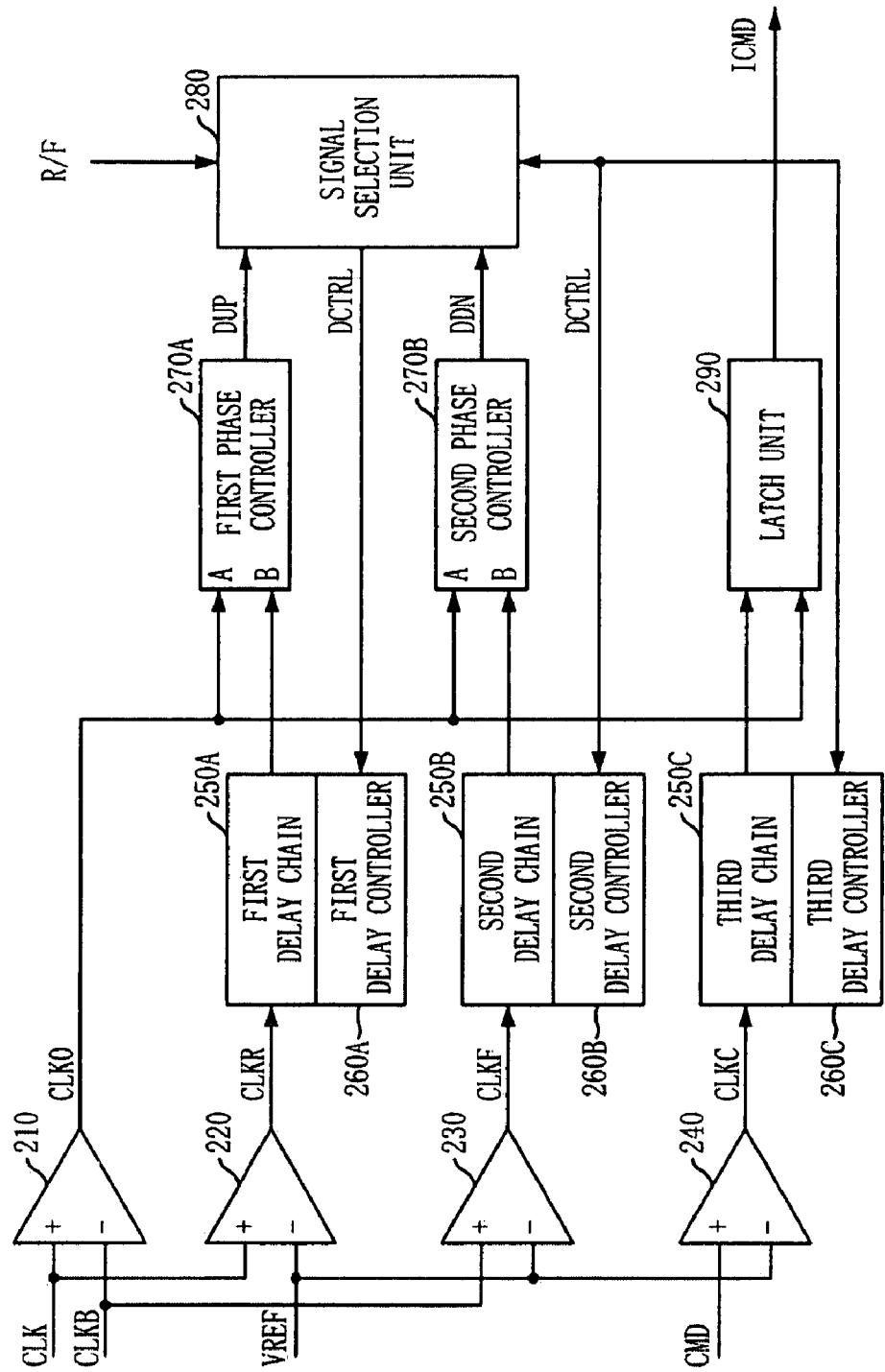
FIG. 7 is a block diagram of a semiconductor memory device in accordance with a second embodiment of the present invention.

FIG. 7 is a block diagram of a semiconductor memory device in accordance with a second embodiment of the present invention.

As shown, the semiconductor memory device in accordance with the second embodiment of the present invention includes first to third clock input units 210 to 230, a command signal input unit 240, first to third delay chains 250A to 250C, first to third delay controllers 260A to 260C, first and second phase comparators 270A and 270B, a signal selection unit 280, and a latch unit 290.

The first clock input unit 210 receives a system clock signal CLK and an inverted system clock signal CLKB to output a first clock signal CLK0. The second clock input unit 220 receives the system clock signal CLK and a reference signal VREF to output a second clock signal CLKR. The third clock input unit 230 receives the inverted system clock signal CLKB and the reference signal VREF to output a third clock signal CLKF. The command signal input unit 240 receives a command signal CMD and the reference signal VREF to output a first internal command signal CLKC.

The first delay chain 250A delays the second clock signal CLKR, the second delay chain 250B delays the third clock signal CLKF, and the third delay chain 250C delays the first internal command signal CLKC. Each of the first to third delay controllers 260A to 260C controls a delay amount of a corresponding one of the first to third delay chains 250A to 250C in response to a delay control signal DCTRL. Each of the first to third delay chains 250A to 250C and the first to third delay controllers 260A to 260C has substantially the same structures as those of the delay chains and the delay controllers shown in FIG. 5.

The first phase comparator 270A compares a phase of the first clock signal CLK0 with that of an output signal of the first delay chain 250A to output an up signal DUP according to the comparison result. The second phase comparator 270B compares the phase of the first clock signal CLK0 with that of an output signal of the second delay chain 250B to output a down signal DDN according to the comparison result. The signal selection unit 280 outputs the delay control signal DCTRL by selecting one of the up signal DUP and the down signal DDN in response to a selection signal R/F. The latch unit 290 latches an output signal of the third delay chain 250C in response to the first clock signal CLK0 to output an internal command signal ICMD.

As described above, the semiconductor memory device in accordance with the second embodiment of the present invention compares a phase of the system clock signal CLK with that of the inverted system clock signal CLKB inputted to the semiconductor memory device to thereby control a delay amount of the command signal CMD, not a delay amount of a system clock signal. For this, the semiconductor memory device further includes the command signal input unit 240, the third delay chain 250C, the third delay controller 260C, and the latch unit 290.

Further, the semiconductor memory device detects a voltage difference between an intersection of the system clock signal CLK and the inverted system clock signal CLKB and the reference signal VREF, and outputs the delay control signal DCTRL to the third delay controller 260C in response to the detection result. The third delay controller 260C controls a delay amount of the first internal command signal CLKC in response to the delay control signal DCTRL. The latch unit 290 latches the output signal of the third delay chain 250C in response to the first clock signal CLK0. Herein, since a signal input to the latch unit 290 is a delayed signal in response to the voltage difference between the intersection of the system clock signal CLK and the inverted system clock signal CLKB and the reference signal VREF, the latch unit 290 latches the input signal at an appropriate timing in response to the first clock signal CLK0 outputted from the first clock input unit 210.

Accordingly, the semiconductor memory device in accordance with the second embodiment of the present invention does not delay the system clock signal but the command signal in response to delay amount of the system clock signal CLK and the inverted system clock signal CLKB inputted to the semiconductor memory device. As a result, it is possible to latch data, addresses and commands at an appropriate timing.

As described above, the semiconductor memory device in accordance with the present invention can latch data, addresses and commands at an appropriate timing of a system clock input to the semiconductor memory device regardless of a position where the semiconductor memory device is located in a module. As a result, the semiconductor memory device can optimize setup and hold time margins of the data, the addresses and the commands.

Furthermore, a memory module in accordance with the present invention has a plurality of semiconductor memory device capable of receiving input signals such as data, addresses and commands at an appropriate timing of a system clock. Accordingly, it is possible to reliably store and output data in the memory module, thereby improving performance of a system using the memory module.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a first clock input unit for generating a first clock signal based on an intersection of a system clock signal and an inverted system clock signal;

a second input unit for generating a second clock signal based on an intersection of the system clock signal and a reference signal;

a third input unit for generating a third clock signal based on an intersection of the inverted system clock signal and the reference signal;

a delay unit for generating a delay clock signal by delaying the first clock signal in response to a delay control signal; and a clock delay control unit for generating the delay control signal in response to a phase difference between the second clock signal and the delay clock signal or a phase difference between the third clock signal and the delay clock signal.

2. The semiconductor memory device as recited in claim 1, wherein the delay unit includes:

a delay chain for delaying the first clock signal to generate the delay clock signal; and a delay controller for controlling delay amount of the delay chain in response to the delay control signal.

3. The semiconductor memory device as recited in claim 2, wherein the delay chain includes a plurality of unit delays connected in series so that the first clock signal passes through a number of unit delays corresponding to a plurality of control signals outputted from the delay controller.

4. The semiconductor memory device as recited in claim 3, wherein the delay controller includes:

a signal combination unit for generating a shifting control signal based on the first clock signal and the delay control signal; and a shifter register for shifting the plurality of control signals to left or right and outputting the shifted control signals in response to the shifting control signal.

5. The semiconductor memory device as recited in claim 1, wherein the clock delay control unit includes:

a first phase comparator for comparing a phase of the second clock signal with that of the delay clock signal to output an up signal according to the comparison result;

a second phase comparator for comparing a phase of the third clock signal with that of the delay clock signal to output a down signal according to the comparison result; and a signal selection unit for selecting one of the up signal and the down signal and outputting the selected one as the delay control signal in response to a selection signal.

6. The semiconductor memory device as recited in claim 5, wherein each of the first and second phase comparators includes one or more flip-flops.

7. The semiconductor memory device as recited in claim 5, wherein the signal selection unit includes:

a first transmission gate for transferring the up signal to the delay controller in response to a first logic level of the selection signal; and a second transmission gate for transferring the down signal to the delay controller in response to a second logic level of the selection signal.

8. A method for driving a semiconductor memory device, comprising:

generating a first clock signal based on an intersection of a system clock signal and an inverted system clock signal;

generating a second clock signal based on an intersection of the system clock signal and a reference signal;

generating a third clock signal based on an intersection of the inverted system clock signal and the reference signal;

generating a delay clock signal by delaying the first clock signal by a predetermined delay amount; and controlling the predetermined delay amount in response to a phase difference between the second clock signal and the delay clock signal or a phase difference between the third clock signal and the delay clock signal.

9. The method as recited in claim 8, wherein the controlling of the predetermined delay amount includes:

comparing a phase of the second clock signal with that of the delay clock signal;

comparing a phase of the third clock signal with that of the delay clock signal; and controlling the predetermined delay amount according to the comparison results.

10. A semiconductor memory device, comprising:

a first clock input unit for generating a first clock signal based on an intersection of a system clock signal and an inverted system clock signal;

a second clock input unit for generating a second clock signal based on an intersection of the system clock signal and a reference signal;

a third clock input unit for generating a third clock signal based on an intersection of the inverted system clock signal and the reference signal;

a command signal input unit for receiving a command signal and the reference signal to output a first internal command signal;

a clock delay control unit for generating a delay control signal in response to a phase difference between the first clock signal and the second clock signal or a phase difference between the first clock signal and the third clock signal;

a command delay unit for generating a second internal command signal by delaying the first internal command signal in response to the delay control signal; and a latch unit for latching the second internal command signal in response to the first clock signal.

11. The semiconductor memory device as recited in claim 10, wherein the command delay unit includes:

a command delay chain for delaying the first internal command signal to generate the second internal command signal; and a command delay controller for controlling a delay amount of the command delay chain in response to the delay control signal.

12. The semiconductor memory device as recited in claim 11, wherein the command delay chain includes a plurality of unit delays connected in series so that the first internal command signal passes through a number of unit delays corresponding to a plurality of control signals outputted from the command delay controller.

13. The semiconductor memory device as recited in claim 12, wherein the command delay controller includes:

a signal combination unit for generating a shifting control signal based on the first internal command signal and the delay control signal; and a shifter register for outputting the plurality of control signals by shifting the plurality of control signals to left or right in response to the shifting control signal.

14. The semiconductor memory device as recited in claim 10, wherein the clock delay control unit includes:

a first delay chain for delaying the second clock signal;

a first delay controller for controlling a delay amount of the first delay chain in response to the delay control signal;

a second delay chain for delaying the third clock signal, a second delay controller for controlling a delay amount of the second delay chain in response to the delay control signal;

a first phase comparator for comparing a phase of the first clock signal with that of an output signal of the first delay chain to output an up signal according to the comparison result;

a second phase comparator for comparing the phase of the first clock signal with that of an output signal of the second delay chain to output a down signal according to the comparison result; and a signal selection unit for generating the delay control signal by selecting one of the up signal and the down signal in response to a selection signal.

15. A method for driving a semiconductor memory device, comprising:

generating a first clock signal based on an intersection of a system clock signal and an inverted system clock signal;

generating a second clock signal based on an intersection of the system clock signal and a reference signal;

generating a third clock signal based on an intersection of the inverted system clock signal and the reference signal;

generating a first internal command signal based on a command signal and the reference signal;

generating a delay control signal in response to a phase difference between the first clock signal and the second clock signal, or a phase difference between the first clock signal and the third clock signal;

generating a second internal command signal by delaying the first internal command signal in response to the delay control signal; and latching the second internal command signal in response to the first clock signal.

16. The method as recited in claim 15, wherein the generating of the delay control signal includes:

comparing a phase of the first clock signal with that of the second clock signal;

comparing a phase of the first clock signal with that of the third clock signal; and generating the delay control signal according to the comparison results.

* * * * *